(12) United States Patent
Wampler, II et al.

(10) Patent No.: US 10,950,903 B2
(45) Date of Patent: *Mar. 16, 2021

(54) BATTERY STATE ESTIMATION USING ELECTRODE TRANSIENT MODEL

(71) Applicant: GM Global Technology Operations LLC, Detroit, MI (US)

(72) Inventors: Charles W. Wampler, II, Birmingham, MI (US); Daniel R. Baker, Romeo, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 152 days.

This patent is subject to a terminal disclaimer.

(21) Appl. No.: 16/213,159

(22) Filed: Dec. 7, 2018

(65) Prior Publication Data

US 2020/0185792 A1 Jun. 11, 2020

(51) Int. Cl.
*H02J 7/00* (2006.01)
*H01M 10/48* (2006.01)
*H01M 10/42* (2006.01)
*H01M 10/0525* (2010.01)
(Continued)

(52) U.S. Cl.
CPC .......... *H01M 10/482* (2013.01); *B60L 58/12* (2019.02); *H01M 10/0525* (2013.01); *H01M 10/4207* (2013.01); *H01M 10/4257* (2013.01); *H01M 10/441* (2013.01); *H01M 10/443* (2013.01); *H01M 10/486* (2013.01); *H01M 10/488* (2013.01); *H02J 7/0021* (2013.01); *H01M 2010/4271* (2013.01); *H01M 2010/4278* (2013.01); *H01M 2220/20* (2013.01)

(58) Field of Classification Search
CPC .......... H01M 10/482; H01M 10/4257; H01M 10/486; H01M 10/4207; H01M 10/0525; H01M 10/488; H01M 10/443; H01M 10/441; H01M 2010/4278; H01M 2010/4271; H01M 2220/20; B60L 58/12
See application file for complete search history.

(56) References Cited

U.S. PATENT DOCUMENTS

7,324,902 B2 * 1/2008 Verbrugge ........... G01R 31/367
    702/64
7,373,264 B2  5/2008 Verbrugge et al.
(Continued)

*Primary Examiner* — Nghia M Doan
(74) *Attorney, Agent, or Firm* — Quinn IP Law (57) ABSTRACT

An electrical system includes a battery pack, sensors, and a controller. The sensors configured output measured state signals indicative of an actual state of the battery back, including a respective actual voltage, current, and temperature of each of the multiple battery cells. The controller executes a method to generate, responsive to the measured state signals, an estimated state of the multiple battery cells using a respective open-circuit voltage and low-frequency transient voltage of each of the multiple battery cells. The controller estimates the low-frequency transient voltages using a porous electrode transient (PET) model as part of a model set, the PET model having open-circuit voltage elements representing uneven charge distribution within a cell electrode. State of charge (SOC) of the battery pack is estimated using the estimated voltages. An operating state of the electrical system is controlled in real-time responsive to the estimated SOC.

20 Claims, 5 Drawing Sheets

(51) Int. Cl.
 *H01M 10/44* (2006.01)
 *B60L 58/12* (2019.01)

(56) References Cited

U.S. PATENT DOCUMENTS

| | | | |
|---|---|---|---|
| 8,321,164 B2* | 11/2012 | Liu | G01R 31/382 |
| | | | 702/63 |
| 9,377,512 B2* | 6/2016 | Frost | B60L 50/66 |
| 2015/0219726 A1 | 8/2015 | Lenz et al. | |
| 2019/0170830 A1* | 6/2019 | Ohkanda | G01R 19/16542 |
| 2020/0182937 A1* | 6/2020 | Wampler, II | H02J 7/14 |

\* cited by examiner

BATTERY STATE ESTIMATION USING ELECTRODE TRANSIENT MODEL

INTRODUCTION

The present disclosure relates to electrical systems employing rechargeable battery packs. Aspects of the disclosure pertain to the real-time estimation of the battery pack's equilibrium cell voltage, and the use of the same to estimate the pack's state of charge (SOC) or state of power (SOP). As commonly used in the art, the term "state of charge" is the battery energy, usually expressed as a percentage, that remains available for use in the battery's various cells relative to a respective SOC of a fully-charged battery pack. "State of power" describes the remaining power capability of the battery pack after a predefined duration of maximum use, e.g., 2 s or 10 s. Monitoring of the battery state enables optimal control and power flow decision making to occur during charging or discharging operations. Thus, electrified vehicles, powerplants, and other electrified systems benefit from use of a battery management system that is better able to track the evolving internal state or states of the battery pack between actual state measurements. The present disclosure lends itself to supporting such applications.

A battery cell includes positive and negative electrodes. In the present state of the art, such cells are often made of porous materials permeated with a liquid electrolyte. During charging of an example lithium-ion battery cell, for instance, lithium atoms diffuse to the surface of the positive electrode where an electrochemical reaction occurs. This electrochemical reaction produces positively-charged lithium ions, which then migrate through the electrolyte solution in the pores of the positive electrode, cross a separator that prevents direct contact between the positive and negative electrodes, and thereafter migrate into the pores of the negative electrode. The lithium ions eventually reach the negative electrode surface, whereupon the ions undergo a second electrochemical reaction. The lithium ions then diffuse into the negative electrode material.

The direction of the above-noted reactions and flow of lithium ions reverses during discharge of the battery cell. The above-noted example lithium species may be replaced by other application-suitable chemical species, and for some battery constructions only one of the two electrodes may be porous. The disclosed methodology is useful without respect to the particular chemical species used in constructing the battery cells, so long as at least one of the electrodes is porous.

The nature of the physicochemical processes governing the flow of chemical species is such that the concentration of each species is not necessarily uniform through a given electrode. Such non-uniformity results in differences in the local SOC at various points in the electrode material. In particular, the local SOC in the front of the electrode, that is, nearest the separator region, may differ from the local SOC in the back of the same electrode, that is, nearest the current collector, giving thereby a front-to-back SOC disparity.

A battery cell resting at open circuit, given sufficient time, will settle to an equilibrium voltage referred to as the cell's open-circuit voltage (OCV). Ideally, the OCV of a given battery cell is unique for each SOC, independent of whether the battery cell was charging or discharging just before switching to an open-circuit condition, and also independent of the magnitude of the battery current. OCV increases monotonically as the cell's SOC increases, and thus the relationship between OCV and SOC is invertible. That is, with x being a fractional SOC, i.e., $0 \le x \le 1$, and $V_o$ representing the OCV, a non-linear OCV curve is defined by the function $V_o = U(x)$, which is invertible as $x = U^{-1}(V_o)$. Accordingly, once a given battery cell has rested long enough and its OCV is accurately measured, the SOC may be roughly estimated.

In hybrid electric or battery electric vehicles, battery state estimator (BSE) logic may reference such an OCV curve to estimate SOC in real-time. Alternatively, SOC may be tracked from an initial SOC x(0) at t=0 using a procedure referred to as Coulomb counting, i.e., $$x(t) = x(0) + \frac{1}{Cap} \int_0^t I(\tau) d\tau,$$

where Cap is the capacity of the battery cell and $I(\tau)$ is the battery current. BSE logic may balance voltage-based estimates and Coulomb-based estimates to produce a composite estimate. Since Coulomb counting is inherently open-loop and subject to accumulation of integration error, a voltage-based estimate serves as an important closed-loop check. Accuracy of determination of the above-noted OCV curve and real-time state estimation problem are complicated by the presence of circuit resistance and voltage transients, as well as charge transfer physics occurring within the battery cell itself, all of which may combine to render existing SOC/SOP estimation techniques less than optimal under certain conditions.

SUMMARY

A battery state estimation (BSE) method is disclosed herein for use with an electrical system having a multi-cell battery pack. While a lithium-ion chemistry is described as an example battery chemistry species, the teachings are not limited so lithium-ion batteries, but rather to battery configurations having at least one electrode that is porous in the manner set forth above. As part of the disclosed approach, a controller is programmed to execute instructions embodying the present method and thereby determine cell voltages of the various battery cells, either via modeling or sensor-based measurement. From such estimates, the controller derives a state of charge (SOC) and possibly a state of power (SOP) of the battery pack.

Graphite is widely used as the active material in negative electrodes of lithium-ion batteries. The present method is of particular applicability to such a material, as the OCV curve of a graphite electrode has several almost flat regions, often referred to as plateaus, with relatively sharp transitions between the plateaus. Near these transitions, a small difference in local SOC of the electrode, such as a front-to-back SOC disparity, may have a significant, albeit transient, effect on the terminal voltage. If the transient voltage effect is not properly taken into account, an inaccurate real-time battery state estimation may result. Thus, discrete/single-layer bulk estimations of the battery cell's SOC may result in less than optimally accurate real-time battery state estimations. The present method is intended to help improve such state estimations by carefully considering such transient effects.

Each electrode has a corresponding open-circuit voltage (OCV) curve, which can be experimentally measured relative to a common reference, typically pure lithium. The OCV observed at a cell's terminals is the difference between two half-cell OCVs of the cell. A difference in the local SOC, such as a front-to-back SOC disparity, can result in different OCVs at different points in the electrode. The voltage measured at the battery's terminals is influenced by these local voltages. If the battery cell is allowed to rest at open circuit, lithium (in a lithium-ion embodiment) will move from regions of high concentration towards regions of low concentration, both by diffusion within the solid materials of the electrode and by the aforementioned processes whereby lithium de-intercalates from regions of higher local SOC, migrates through the electrolyte in the pores, and intercalates into regions of lower local SOC. This results in transients in the voltage measured at the terminals. As the local SOC throughout the electrode equilibrates to a uniform bulk SOC, the terminal voltage settles to the cell OCV. Accordingly, to more accurately estimate the bulk SOC in real-time given measurements of the terminal voltage, it is desirable to compensate the measured voltage to remove the transient effects. The present method has the benefit of removing such effects.

In particular, the controller used in the present strategy addresses the potential problem of such transient effects using a porous electrode transient (PET) model as part of a collective model set. The PET model is configured to model low-frequency transient voltage effects occurring in the battery cells during charging or discharging. The PET model considers charge distribution at a multitude of discretized "layers" of a given electrode, e.g., the negative electrode. As few as three such discretized layers may be used in some embodiments, with up to seven to ten such layers being sufficient in other embodiments, and thus the excess computational burden associated with the present method is minimal. More or fewer discretized layers may be modeled as needed via the PET model to provide a desired computational load-performance tradeoff.

In particular, the controller compensates for the above-noted differences in SOC distribution through the electrode depth by adding a voltage adjustment to an OCV value, with such an adjustment predicted by the PET model. The PET model may be embodied as a transmission line/equivalent circuit consisting of multiple OCV elements, each of which may be in series with its own calibrated/predetermined charge-transfer resistance and connected in parallel to its neighbors by an effective pore resistance, with both resistance values being temperature-dependent. Another approach uses a discretized transient model of partial differential equations (PDE) to the same ends.

In an example embodiment, an electrical system includes a battery pack with multiple battery cells, sensors, and the above-mentioned controller, the latter being configured to execute the present method. The sensors output measured state signals indicative of an actual state of the battery back, with the actual state of the battery pack including respective actual cell voltages, currents, and temperatures of each of the multiple battery cells. Responsive to the measured state signals, the controller generates an estimated state of charge (SOC) of the battery pack and thereafter controls an operating state of the electrical system in real-time responsive to the estimated SOC.

The multiple OCV elements may be represented in a memory location of the controller as an equivalent circuit model. Such an equivalent circuit model may include a calibrated charge-transfer resistance and a calibrated effective pore resistance for each of a desired number (N) of discretized layers of the electrode. Here, N is equal to a number of the multiple OCV elements, e.g., N≥3 in a non-limiting embodiment. Other values of N may be used in other embodiments, e.g., N≥5. The charge-transfer resistance and pore resistance are temperature-dependent values, as will be appreciated by those of ordinary skill in the art.

The multiple OCV elements may be alternatively represented in the memory location of the controller as a set of partial differential equations (PDEs) representing a continuous SOC distribution $\theta_e(t,z)$, where t is time and z is a nondimensional depth of the electrode.

The battery cells may be lithium ion battery cells in some embodiments, and/or the electrode may be a negative electrode.

The controller may periodically update the PET model, and the collective model set of which the PET model is an integral part, based on a difference between the estimated and actual voltages, e.g., using a Kalman filter or a variant thereof.

The electrical system may be in communication with a display device, with the controller configured to display the SOC via the display device.

In some embodiments, the controller may derive a numeric state of health of the battery pack using a time history of the estimated state, and also output a signal indicative of the numeric state of health.

An electric machine may be coupled to a load, such that in the discharging mode, the electric machine acts as a traction motor to power the load. Likewise, when the electric machine is a motor-generator unit, the machine may operate as an electric generator to draw power from the load, e.g., in a regenerative braking mode. In some embodiments, the load is a set of drive wheels of a motor vehicle.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the appended claims.

The present disclosure is susceptible to modifications and alternative forms, with representative embodiments shown by way of example in the drawings and described in detail below. Inventive aspects of this disclosure are not limited to the particular forms disclosed. Rather, the present disclosure is intended to cover modifications, equivalents, combinations, and alternatives falling within the scope of the disclosure as defined by the appended claims.

DETAILED DESCRIPTION

Figure 1:
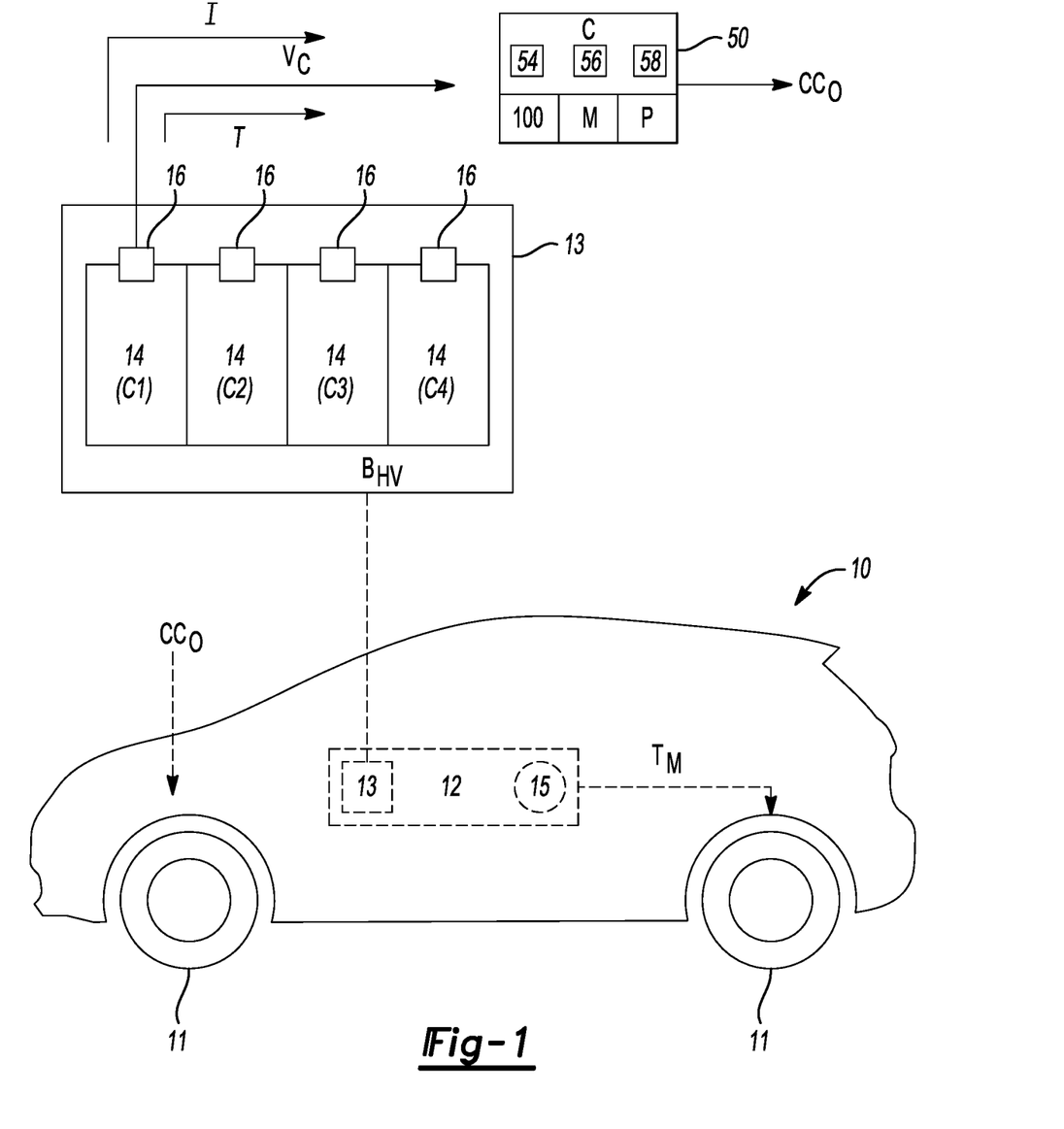
FIG. 1 is a schematic illustration of an example vehicle having an electrical system that includes a battery pack and a controller configured to estimate a state of the battery pack using a porous electrode transient model in the overall control of the vehicle.

Referring to the drawings, wherein like reference numbers refer to like components, FIG. 1 depicts an example vehicle 10 having a set of drive wheels 11 powered via an electrical system 12. Power flow to or from the electrical system 12 is managed by a controller (C) 50, e.g., a battery system manager or other control device(s), with the controller 50 regulating operation of the electrical system 12 via a set of output signals (arrow $CC_O$). The vehicle 10 may be optionally embodied as a hybrid electric vehicle or a battery electric vehicle in which the electrical system 12 ultimately generates and delivers propulsion torque to the drive wheels 11. While the vehicle 10 is described hereinafter as one example type of high-energy system that may benefit from the present teachings, vehicles may be envisioned other than the illustrated motor vehicle 10, e.g., aircraft, marine vessels, or rail vehicles, as well as stationary or mobile powerplants, platforms, robots, etc., without limitation.

The electrical system 12 includes a relatively high-voltage battery pack ($B_{HV}$) 13 having a plurality of battery cells 14. Four such battery cells 14 are individually labeled C1, C2, C3, and C4 in FIG. 1. The actual number and voltage level of battery cells 14 used to form the battery pack 13 is application-specific, and thus depends on the energy requirement of the particular system or systems being powered by the battery pack 13. Embodiments of the battery pack 13 may include lithium-ion, nickel metal-hydride, or other suitable battery chemistries. The electrical system 12 may also include one or more electric machines 15, e.g., traction motors or motor-generator units coupled to the road wheels 11 directly or via intervening gear arrangements and drive axles, a power inverter module for inverting DC power from the battery pack 13 into a polyphase voltage suitable for energizing windings of the electric machine 15, etc. Thus, motor torque (arrow $T_M$) may be delivered to the drive wheels 11 in an embodiment. Or, when the electric machine 15 is operating as an electric generator, the electric machine 15 may draw power from the load, in this case the road wheels 11, when the operating state is a charging state of the battery pack 13.

The controller 50 of FIG. 1 may be used as part of a battery management subsystem employing battery state estimation (BSE) techniques. That is, the controller 50 shown schematically in FIG. 1, which may be embodied as part of a battery management system or as a separate device, has one or more low-voltage digital computers including a processor (P), e.g., a microprocessor or central processing unit, as well as memory (M) in the form of read only memory, random access memory, electrically-programmable read only memory, etc., a high-speed clock, analog-to-digital and digital-to-analog circuitry, input/output circuitry and devices, and appropriate signal conditioning and buffering circuitry. The controller 50 may have as part of its designated control functionality the tasks of monitoring and controlling temperature, state of charge, voltage, and other performance characteristics of the battery pack 13.

As part of a computer-executable method 100 for estimating a present state of the battery pack 13, the controller 50 may model or receive individual cell voltage measurements (arrow $V_C$) from each of the sensors 16, as well measure the cell temperatures (arrow T) and currents (arrow I). In executing the method 100, the controller 50 derives the present battery state using the estimated states, particularly cell voltage, including at least a state of charge (SOC) and a state of power (SOP) of the battery pack 13. The controller 50 does so with the assistance of a collective model set 61 (see FIG. 5) having one or two porous electrode transient (PET) models 58, the latter of which derives low-frequency transient voltage effects during charging or discharging of the battery pack 13. Each PET model 58 ultimately determines how charge varies unevenly through a depth of a given negative or positive electrode of each battery cell 14. SOC estimation results using such temperature-based voltage estimates are then adapted in real-time based to improve the accuracy of the collective model set 61 inclusive of the PET model 58.

Figure 2:
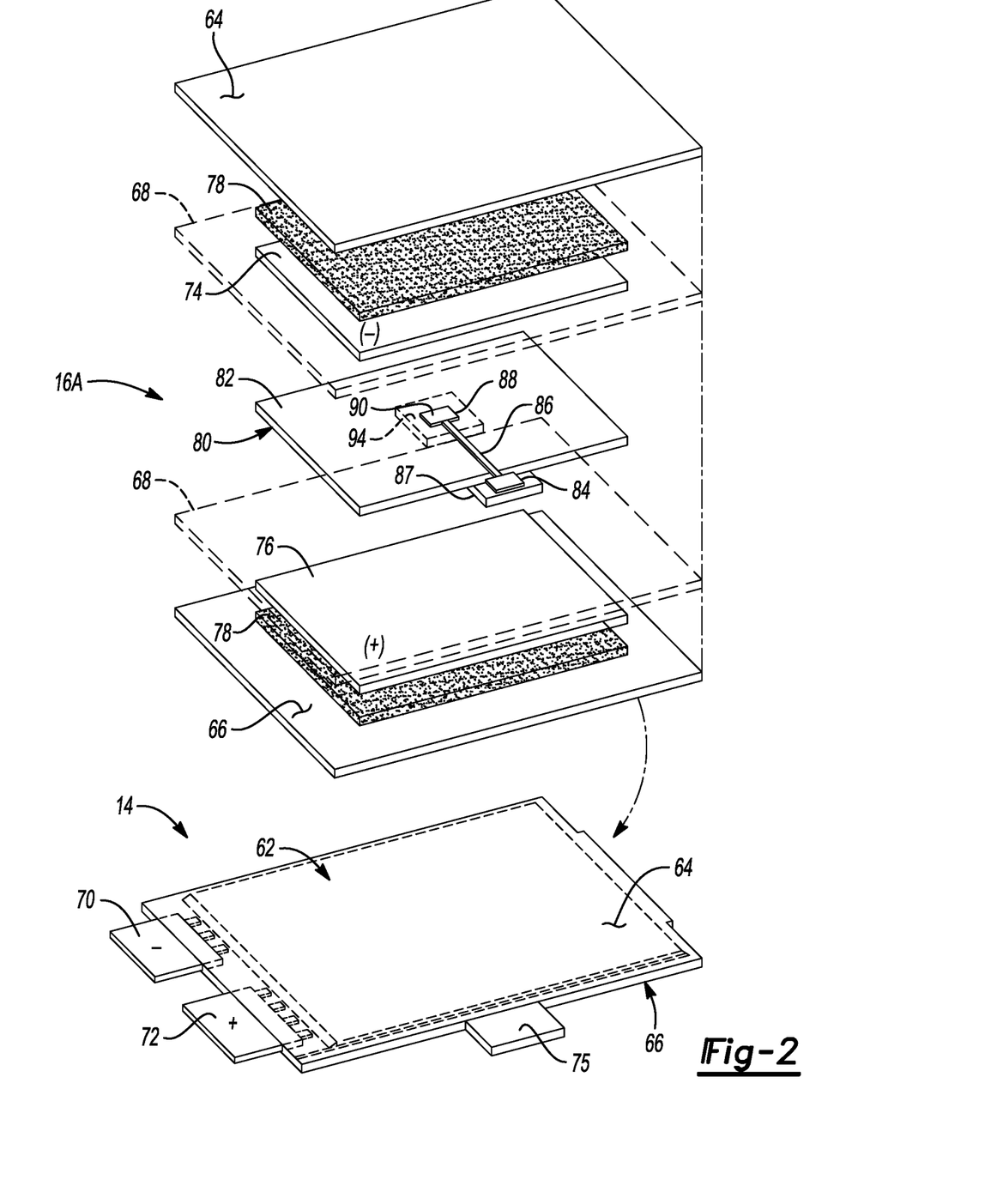
FIG. 2 is a schematic illustration of an example battery cell whose state may be estimated in real time according to the present approach.

Referring to FIG. 2, according to a representative configuration the battery pack 13 is generally composed of an array of battery cells 14. While lithium-ion battery cells 14 are described below, the disclosed concepts may be similarly applicable to other electric storage architectures, including those employing nickel metal hydride (NiMH) batteries, lithium polymer batteries, or other types of high-energy batteries. As shown, each battery cell 14 is a multi-layer construction provided with an outer housing, represented at the bottom of FIG. 2 by an envelope-like pouch 62 having generally flat, rectangular major facing sides 64 and 66. The respective sides 64 and 66 may be formed of aluminum sheet or foil or other suitable material, and coated with a polymeric insulating material. Sides 64 and 66 are connected, such as via welding or crimping, to enclose a liquid electrolyte (shown schematically at 68) that conducts positive lithium ions. Extending outwardly from longitudinal edges of the sides 64 and 66 are negative (−) and positive (+) tabs 70 and 72, respectively, for making electrical connections with respective negative (−) and positive (+) electrodes (anode 74 and cathode 76) within an internal volume of the pouch 62.

The pouch 62 is shaped and sized to contain a stack of repeated units of lithium-ion cell components, with a single unit or battery cell 14 generally composed of electrodes in the form of an anode 74 and a cathode 76, and with a series of porous separator sheets 78 interleaved between the anode 74, cathode 76, and sides 64 and 66 of the pouch 62. The anode 74 and cathode 76 are operatively attached to the pouch 62 and placed in electrochemical contact with the electrolyte composition 68 such that ions are transferable therebetween during charging or discharging. In a lithium-ion embodiment, the cathode 76 is fabricated from material that is capable of supplying lithium ions during a battery charging operation, and incorporating lithium ions during a battery discharging operation. The cathode 76 may include, for instance, a lithium metal oxide, phosphate, or silicate. Separator sheets 78 may each be composed of a porous polyolefin membrane, e.g., with a porosity of about 35% to 65%, and a thickness of approximately 25-30 microns. The separator sheets 78 may be modified, for instance, by the addition of electrically non-conductive ceramic particles (e.g., silica) that are coated on the porous membrane surfaces.

A reference electrode 80 may be used, but it not necessary for the functioning of the disclosed method 100. Instead, the method 100 may rely on modeling of the terminal voltage across both half-cells as set forth herein. When the reference electrode 80 is available, BSE may be performed on the two half-cells, with the PET model applied twice (once per half-cell). For the optional sensing purposes within the scope of the method 100, a sensor 16A formed with the reference electrode 80 may be interposed between the anode 74 and the cathode 76, and placed in electrochemical contact with the electrolyte composition 68. The reference electrode 80 may function as a third electrode that independently measures a voltage of the anode 74 and cathode 76. The reference electrode assembly 80 may be fabricated with a separator sheet 82 that supports an electrical contact 84, an electrical track 86, and an electrical lead 88. The dedicated separator sheet 82 is fabricated from an electrically insulating, porous polymeric material, such as polyethylene or polypropylene, or a combination of both. Thin porous separator sheet 82 may be interposed in face-to-face non-contacting relation between parallel faces of anode and cathode 74 and 76, with the lithium ion-containing electrolyte solution 68 permeating and filling the pores and contacting the surfaces of sheet 82. An optional jacket separator (not shown) may be disposed across and cover one or both sides of the separator sheet 82, e.g., to help ensure no direct physical contact with the anode and cathode 74 and 76.

In the illustrated example, a support tab 87 may project transversely from a lateral edge of the elongated separator sheet 82, with the electrical contact 84 deposited on or otherwise affixed to the support tab 87. The electrical track 86 electrically connects the electrical lead 88 to the electrical contact 84. The reference electrode assembly 80 may be fabricated with an intercalation electrode 90 that is deposited on the support sheet 82 and attached to the electrical lead 88. In the illustrated assembly configuration, electrically non-conductive particles may be deposited to create a very thin alumina layer 94 that is deposited on and covers the intercalation electrode 90 and, consequently, the electrical track 86. This alumina layer 94, which may be only a few atoms thick, helps to stabilize the reference electrode assembly 80, e.g., for a longer life.

In a multi-layer stack, a plurality of the reference electrode assemblies 80 may be inserted at several positions throughout the stack for redundancy. In such an instance, support tabs 75 for the various reference electrode assemblies 80 can be interconnected for a single readout, as it may be expected that they all have the same (or nearly the same) voltage. Additionally, by providing multiple, independently operating reference electrodes, if one reference connection fails, the signal will likely remain valid with the remaining reference connection(s).

As noted above, two available techniques for estimating SOC include (1) Coulomb counting (integrating current), and (2) voltage lookup. For Coulomb counting:

$$SOC = SOC(t_0) + \frac{1}{Cap}\int_{t_0}^{t_1} I(t)dt$$

where $SOC(t_0)$ is an initial state of charge value (typically SOC=100% after a full charge). Errors in measuring current, I(t), may lead to an accumulation of error in SOC (e.g., more error may accumulate the longer the time period since a last full charge and the larger the number of partial charges). Uncertainty in the battery capacity (Cap) may also lead to an error in Coulomb counting. This uncertainty tends to grow over time as capacity tends to degrade over the life of a battery. The alternative technique of estimating SOC using a voltage lookup technique may rely on the fact that, when the battery pack 13 is fully rested, the equilibrium voltage/OCV uniquely indicates the SOC. In addition to or in lieu of such approaches, the present method 100 may be used to improve accuracy of state estimation by treating the variations in charge through the depth of the anode 74 or cathode 76, as will now be set forth in detail with reference to the remaining Figures.

Figure 3:
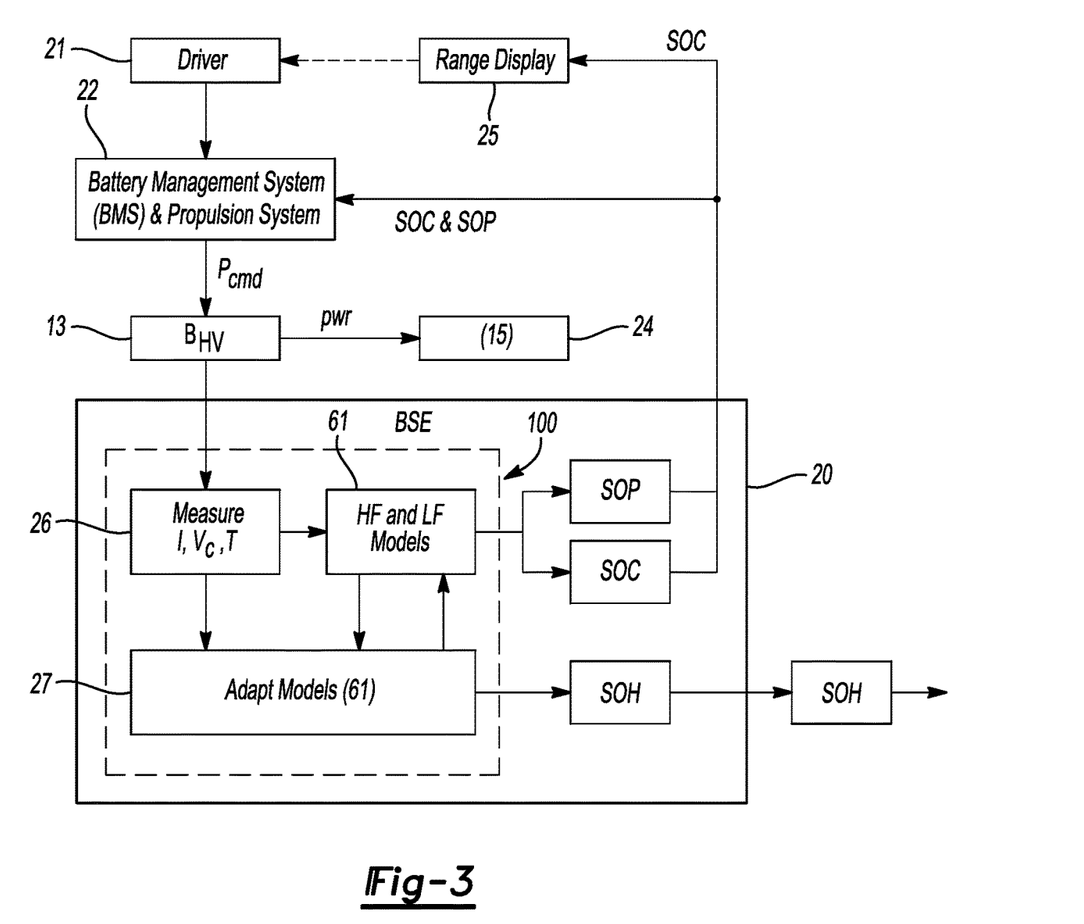
FIG. 3 is a schematic logic flow diagram of the battery pack and controller of FIG. 1.

FIG. 3 is a schematic flow diagram of components and control blocks used in the overall battery state estimation (BSE) process. As will be appreciated, knowledge of SOC and SOP are highly desirable for proper and accurate battery management. Improved BSE accuracy means that operation may be possible much closer to established battery limits, and thus faster charge completion is possible near the top of an SOC range. An ability to operate at low SOC for improved range is also possible, with an improved tradeoff between life and performance.

To provide such benefits, a BSE logic block 20 is programmed in logic of the controller 50 shown in FIG. 1, with control inputs fed into the BSE logic block 20 from the battery pack 13 including the cell voltage ($V_C$) noted above. The BSE logic block 20 may reside in the controller 50 or in a separate computer device. A driver 21 (see FIG. 3) of the vehicle 10 shown in FIG. 1 imparts driver requests that are processed by the controller 50. In response, the controller 50, e.g., via a battery management system (BMS) and propulsion system logic block 22, outputs a power command (arrow $P_{cmd}$) to the battery pack 13 that either charges or discharges the battery pack 13 depending on the operating mode. In the illustrated example, for instance, the battery pack 13 delivers electrical power (arrow pwr) to a drivetrain 24 of the vehicle 10, e.g., an electric machine.

At the same time, the BSE logic block 20 estimates the SOC, SOP, and possibly other states according to the present method 100 as detailed below with reference to FIGS. 4-6. Estimated voltage and, ultimately, estimated SOC may be used to make various control decisions, including those based on a numeric state of health (SOH) of the battery pack 13, a remaining electric range, etc. An optional range display 25 may use the estimated SOC from the BSE logic block 20 to inform the driver 21 of the remaining charge, not unlike how a fuel gauge is employed to show remaining fuel levels in a fuel tank. SOC and SOP are fed back into the controller 50 and used therein to select powertrain operating modes.

With respect to the BSE logic block 20, various processes and routines are performed to estimate SOC and SOP. For instance, a measurement block 26 with associated hardware, including the 90 shown in FIG. 2, measures the current, voltage, and temperature (I, $V_C$, T, respectively) of the battery pack 13 at one or more locations, such as within each of the battery cells 14. The model set 61 of FIG. 5 is then used to model transient dynamics of the electrodes 74 and/or 76 (see FIG. 2) of the battery cells 14 as set forth herein. The modeled transient dynamics may be used to derive transient SOP and steady-state SOC, which as noted above are fed back to the controller 50 and possibly displayed to the driver 21 via the range display 25. An adapting block 27 may modify or adapt the existing collective model set 61 to more closely match actual behavior of the battery pack 13 as measured periodically by the sensors 16, with the long-term SOH of the battery pack 13 possibly generated as another output, e.g., a value between 0 for a depleted battery pack 13 to 1 for a calibrated/new variant.

Figure 4:
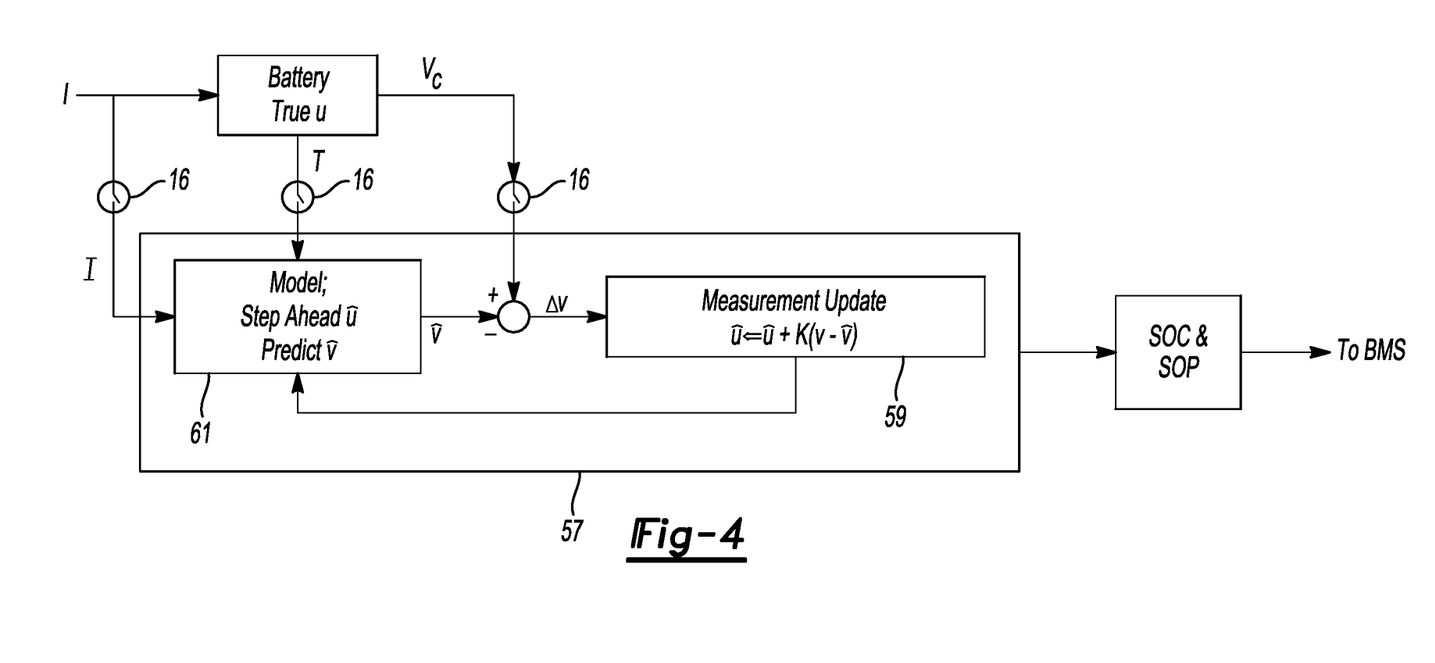
FIG. 4 is a schematic circuit diagram of an equivalent circuit usable as part of the present method.

FIG. 4 depicts a high-level schematic further explaining certain functionality of the BSE logic block 20 of FIG. 3 using an optional Kalman filter block 57. For a specific battery current (I), the controller 50 may use the battery pack's true state u and sensors 16 to determine the voltage (v) and temperature (T) of the battery pack 13. Starting with knowledge of the true state (u), the collective set of models 61 (inclusive of the PET model 58) may be used to estimate a "step-ahead" state vector û, with the term "step-ahead" meaning a new state a single time step ahead of the present state. A predicted voltage p may be subtracted from the measured voltage (v), and the difference (Δv) used as a feedback term to the set of models 61 to correct the models 61.

The Kalman filter methodology or a variant thereof may use a gain matrix K, with K being dependent on the state vector û and its covariance, as well as on measurement uncertainty. The state vector û may include local states of charge, RC-pair voltages, and circuit parameters. Thus, the Kalman filter block 57 is configured to update the full state vector û, i.e.: û⇐û+K(v−v̄) via a corresponding measurement update block 59 as shown. The estimated SOC and SOP may thereafter be output to the controller 50, or battery management system (BMS) logic or hardware components thereof, for further control actions with respect to the electrical system 12 shown in FIG. 1.

Figure 5:
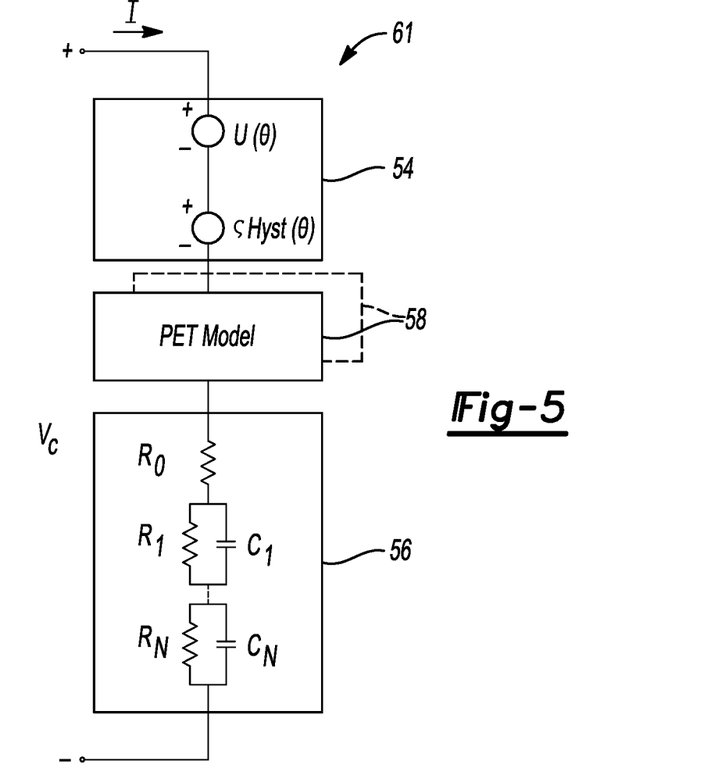
FIG. 5 is a schematic control diagram for estimating states of charge and power using the present method.

FIG. 5 depicts an example circuit model of cell voltage ($V_C$) that illustrates operation and placement of the PET model 58 relative to the within the collective model set 61 shown schematically in FIG. 3. In an open-circuit state, an open-circuit voltage, U(θ), has a non-linear curve relating the open-cell voltage to the state of charge (θ). This applies when the battery pack 13 has rested for a duration at open circuit, i.e., with no current (I) flowing into the battery pack 13, sufficient for reaching equilibrium. The open-circuit voltage is thus an indication of the actual energy in the battery pack 13.

Losses are considered as part of an open-circuit/hysteresis model 54 once the open-circuit voltage has been determined. One such loss is due to the hysteresis offset, which is labeled "ς Hyst(θ)" in FIG. 5, with $-1 \leq ς \leq 1$. An ordinary differential equation may be used to determine ς, e.g., depending on the sign of the battery current (I). In effect, hysteresis is modeled for both charging and discharging modes of operation. Open-circuit voltage and hysteresis from model 54 and the output of the PET model 58 thus collectively capture low-frequency effects. The simplified PET model 58 as used herein neglects several high-frequency phenomena, such as diffusion of lithium intercalating into solid particles, diffusion of lithium ions in the electrolyte solution 68 of FIG. 2, double-layer capacitance, etc. Since the PET model 58 is intended to capture low-frequency transient voltage behavior, rough discretization as set forth herein is considered to be acceptable.

Also considered in the circuit depiction of FIG. 5 is an over-potential RC circuit model 56, which is representable as follows:

$$R_O I + v_1 + \ldots + v_n,$$
$$C_i \dot{v}_i = I - \frac{v_i}{R_i}, I = 1, \ldots, n.$$

Here, a high-frequency resistor $R_O$, possibly with non-linear behavior, is in series with multiple resistor (R)-capacitor (C) pairs, e.g., $R_1 C_1 \ldots R_N C_N$, to collectively represent additional losses that may further affect the open-circuit voltage. Example approaches for implementing RC pairs in an RC circuit model is disclosed in U.S. patent application Ser. No. 14/171,334, published as US 2015/0219726A1 to LENZ et al., which is incorporated by reference in its entirety. High-frequency behavior may be captured by such an approach or other suitable methods.

The PET model 58 is used to consider the effects of insertion or extraction of lithium ions into or out of a porous electrode, e.g., anode 74 or cathode 76 of FIG. 2, which depends on the movement of lithium ions through the electrolyte 68 in the pores between the active electrode particles. The front surface of an electrode, i.e., nearest the respective separator layer 78 of FIG. 2 proximate the anode 74 or cathode 76, responds relatively quickly to an applied current with respect to surfaces or layers located farther away. It thus takes longer for lithium to penetrate all the way to the rear surface of the electrode, i.e., the surface nearest a current collector. The PET model 58 accounts for the resultant uneven state of charge, and can be applied to either or both electrodes 74 and/or 76 of a given battery cell 14. For the present generation of lithium-ion batteries, it is particularly useful when applied to the negative electrode, i.e., anode 74, due to the highly nonlinear open-circuit voltage curve response of graphite.

The PET model 58 noted above may be embodied as an equivalent circuit, or as system of partial differential equations. Both approaches will now be discussed in turn.

Equivalent Circuit: an equivalent circuit representation is one discretized model of charge transfer within an electrode (e), e.g., anode 74 or cathode 76 of FIG. 2. The full-cell OCV is the sum of the OCVs for both electrodes (positive and negative) of a given battery cell 13:

$$U(\theta) = U_{pos}(\theta_{pos}) + U_{neg}(\theta_{neg})$$
$$\theta_e(t) = \theta_e(0) + \frac{1}{C_e} \int_0^t I(\tau) d\tau, e \in \{pos, neg\}$$

Each positive (pos) and negative (neg) electrode has its own starting state of charge (θ) and capacity ($C_e$). In bulk, each electrode sees the same battery current as the full battery cell 13. However, at each layer (k) of the electrode, the current (I) splits into two components: an intercalation current that charges the layer, and a pore current that passes lithium through to the next layer.

There is also a resistance associated with each component of the battery current (I), i.e., a temperature-dependent charge-transfer resistance (r) describing resistance to a transfer of charge into a particle, as will be appreciated, and a temperature-dependent effective pore resistance (R) that is the resistance to moving lithium ions down pores of the electrode, i.e., a function of the electrolyte material 68, pore size, etc. As the number of discretized layers N approaches infinity, the equivalent circuit solution approaches the solution of the partial differential equation (PDE) system that is described below.

Figure 6:
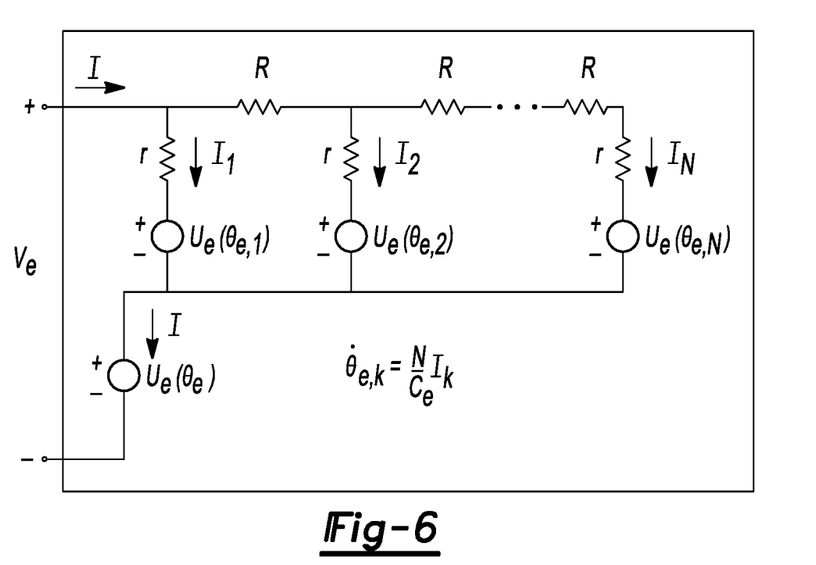
FIG. 6 is an equivalent circuit diagram usable as part of the method in a possible embodiment.

Such an equivalent circuit as depicted in FIG. 6, where $V_e$ is the transient voltage. Thus, the equilibrium value $U_e(\theta_e)$ may be subtracted before inserting into the full model of FIG. 3. The number of discretized layers (N) may also be adjusted. More layers result in a closer approximation to a related PDE system, but also require additional computational resources. In a non-limiting exemplary embodiment, $5 \leq N \leq 7$ for optimal performance tradeoff, although more or fewer layers may be used in other implementations.

Given the total current I, the intercalation currents $I_k$, k=1, ..., N can be calculated by solving the tri-diagonal linear system:

$$(r+R)I_1 - rI_2 = U_2 - U_1 + RI,$$

$$-rI_{k-1} + (2r+R)I_k - rI_{K+1} = U_{k-1} - 2U_k + U_{k+1}, k=2, \ldots, N-1,$$

$$-rI_{N-1} + (r+R)I_N = U_{N-1} - U_N.$$

The time-derivative of the actual state of charge, i.e., $\dot{\theta}_{e,k}$, may be represented as:

$$\dot{\theta}_{e,k} = \frac{N}{C_e} I_k.$$

With N layers of an electrode (e), then $\theta_{e,1}$, $\theta_{e,2}$, $\theta_{e,N}$ represent the individual states of charge for each of the layers 1, 2, . . . , N. Layer 1 in this approach is the layer proximate the separator layer 78 (FIG. 2), and layers 2 through N progressively move away from layer 1 into the depth of the electrode (e).

PDE Model: in another approach, a partial differential equation (PDE) model of the porous electrode (e) has a continuous state of charge distribution $\theta_e(t, z)$, where t represents time and z is a non-dimensional depth through the electrode. Thus, z=0 at the current collector of the battery cell 13 and z=1 at the interface between the electrode and the separator layer, e.g., between separator layer 78 and anode 74 of FIG. 2. Likewise, voltage in the electrolyte 68 in the pores of the electrode is denoted V(t,z). The governing PDE system for use in the PET model(s) 58 is, for t>0 and 0≤z≤1:

$$\frac{\partial}{\partial t}\theta_e = \beta(V - U_e(\theta))$$

$$\frac{\partial^2}{\partial z^2} V = \alpha(V - U_e(\theta))$$

$$\left(\frac{\partial}{\partial z}V\right)_{z=0} = 0, \left(\frac{\partial}{\partial z}V\right)_{z=1} = \frac{\alpha}{\beta C_e} I$$

The temperature-dependent parameters r and R of the equivalent circuit model and the temperature-dependent parameters α and β of the PDE model can be chosen such that the solutions of the equivalent circuit model as the number of discretized layers N approaches infinity approaches the solution of the PDE model. Such the values (r) and (R) may be derived as:

$$r = \frac{N}{\beta C_e}, R = \frac{\alpha}{(N-1)\beta C_e}.$$

Other methods for discretizing the PDE system for approximating its solution may also be used within the scope of the disclosure and thus used as part of method 100. Example approaches, as understood in the art, include finite differences, finite elements, and finite volumes. Of these, the finite volume approach may be of particular benefit, as it can be formulated to preserve charge (i.e., preserve the Coulomb count noted above). Note that the PDE system requires:

$$\frac{\partial}{\partial z}\theta_e = \frac{\beta}{\alpha}\frac{\partial^2}{\partial z^2} V$$

To discretize, the controller 50 may divide the domain of z into N intervals:

$$0 = z_0 < z_1 < \ldots < z_{N+1} < z_N = 1.$$

Then, the controller 50 may define the average state of charge on each interval as:

$$\bar{\theta}_i(t) = \frac{1}{(z_i - z_{i-1})} \int_{z_{i-1}}^{z_i} \theta_e(t, z) dz$$

Thereafter, the time derivative of the averages satisfies the following equation:

$$\frac{d}{dt}\bar{\theta}_i = \frac{1}{(z_i - z_{i-1})}\frac{\beta}{\alpha}\left(\frac{\partial}{\partial z}V(t, z_i) - \frac{\partial}{\partial z}V(t, z_{i-1})\right).$$

The derivatives appearing on the right-hand side of the equation shown immediately above may be obtained by methods of approximating V(t,z) to satisfy its $2^{nd}$ order PDE and boundary conditions. One possibility is a quadratic spline (piecewise quadratic continuous curve with continuous first derivative) which can be made to satisfy the PDE at both boundary conditions and one point in the interior of each interval, typically the center point.

The use of the PET model 58, embodied as the above-described discretized model of one or both electrodes (negative and/or positive) using either the equivalent circuit/transmission line variation or as a discretization of the PDE system, results in PDE system giving:

$$\frac{d}{dt}\theta_k$$

or $$\frac{d}{dt}\bar{\theta}_k, k = 1, \ldots, N.$$

The method 100 "steps ahead" a single time step in each iteration of the Kalman filter of FIG. 4, as noted above. Due to the non-linear nature of the OCV function, i.e., U(θ), exact solutions are generally not available. There are multiple ways of approximating the time step, such as using Forward Euler (explicit time step), Backward Euler (implicit time step), and Crank-Nicolson methods. As will be appreciated, Forward Euler may be expressed as θ(t+Δt)=θ(t)+Δt$\dot{\theta}$(t). Backward Euler may be expressed as θ(t+Δt)=θ(t)+Δt$\dot{\theta}$(t+Δt). Similarly, a Crank-Nicolson formulation may be expressed as θ(t+Δt)=θ(t)+Δt[$\dot{\theta}$(t)+$\dot{\theta}$(t+Δt)]/2. The three methods vary in accuracy, computational complexity, and stability. However, the time steps typical in the BSE logic block 20 of FIG. 3 are on the order of 100 ms, which is smaller than the time scale that dominates the response of the porous electrode. As a result, these example methods would be effective for the disclosed purposes, and therefore the method 100 outlined above may be used to more accurately account for states of charge distributions within an electrode relative to methodologies that effectively treat an electrode as a homogenous layer. Differences in the layers are instead modeled, and the model updated in a calibrated control loop, e.g., once every 50-100 ms, with the possibility of adding additional layers to the strategy as needed to further improve battery state estimation results.

As will be appreciated, the present teachings may be advantageously extended to the vehicle 10 of FIG. 1 in executing a corresponding control action. That is, after estimating battery state in terms of state of charge and/or state of power, the controller 50 of FIG. 1 may display the remaining electric range via the range display 25 of FIG. 3, as noted above. Or, the controller 50 may control operation of the battery pack 13 such as by initiating charging or discharging of the battery pack 13 based on the estimated battery state.

Optional control actions shown in FIG. 3 also include generation of a numeric state of health (SOH) indicative of the present health or remaining useful life of the battery pack 13. For instance, when the SOH is indicative of a degraded battery pack 13, the controller 50 may record a diagnostic code triggering replacement of the battery pack 13 and/or limiting use of the battery pack 13 to critical modes, such as a default "limp home" mode providing sufficient propulsion for reaching a suitable maintenance location. These and other possible control actions and attendant benefits may be readily appreciated by those of ordinary skill in the art in view of this disclosure.

While some of the best modes and other embodiments have been described in detail, various alternative designs and embodiments exist for practicing the present teachings defined in the appended claims. Those skilled in the art will recognize that modifications may be made to the disclosed embodiments without departing from the scope of the present disclosure. Moreover, the present concepts expressly include combinations and sub-combinations of the described elements and features. The detailed description and the drawings are supportive and descriptive of the present teachings, with the scope of the present teachings defined solely by the claims.

What we claim is:

1. An electrical system comprising:
   a battery pack with multiple battery cells each having an electrode;
   a plurality of sensors configured to output measured state signals indicative of an actual state of the battery back, the actual state of the battery pack including a respective actual voltage, current, and temperature of each of the multiple battery cells; and
   a controller configured to:
   receive the measured state signals;
   generate, responsive to the measured state signals, an estimated voltage of the multiple battery cells using a respective open-circuit voltage and low-frequency transient voltage of each of the multiple battery cells, wherein the controller estimates the respective low-frequency transient voltages via a discretized porous electrode transient (PET) model having multiple open-circuit voltage elements in the form of an equivalent circuit model or partial differential equations that individually represent a charge distribution within a respective discretized layer of the electrode, wherein the multiple open-circuit voltage elements collectively represent an uneven charge distribution within the electrode;
   estimate a state of charge (SOC) of the battery pack as an estimated SOC using the estimated voltage; and
   control an operating state of the electrical system in real-time responsive to the estimated SOC.

2. The electrical system of claim 1, wherein the multiple open-circuit voltage elements are represented in a memory location of the controller as the equivalent circuit model including: a charge-transfer resistance and an effective pore resistance for each of a number (N) of discretized layers of the electrode, wherein N is equal to a number of the multiple open-circuit voltage elements.

3. The electrical system of claim 2, wherein N≥3.

4. The electrical system of claim 1, wherein the multiple open-circuit voltage elements of the PET model are represented in a memory location of the controller as a set of the partial differential equations representing a continuous SOC distribution $\theta_e(t,z)$ in the electrode, where t is time and z is a nondimensional depth of the electrode.

5. The electrical system of claim 1, wherein the battery cells are lithium ion battery cells and the electrode is a negative electrode.

6. The electrical system of claim 1, wherein the controller is further configured to periodically update the PET model based on a difference between the estimated voltage and the actual voltage.

7. The electrical system of claim 6, wherein the controller is further configured to periodically update the PET model using a Kalman filter.

8. The electrical system of claim 1, wherein the electrical system is in communication with a display device, and wherein the controller is configured to display the state of charge via the display device.

9. The electrical system of claim 1, wherein the controller is further configured to derive a numeric state of health of the battery pack using a time history of the estimated voltage, and to output a signal indicative of the numeric state of health.

10. The electrical system of claim 1, further comprising: an electric machine coupled to a load, wherein the electric machine is configured to alternatively power the load when the operating state is a discharging state of the battery pack and draw power from the load when the operating state is a charging state of the battery pack.

11. The electrical system of claim 10, wherein the load is a set of drive wheels of a motor vehicle.

12. A battery state estimation method for use with an electrical system having a battery pack with multiple battery cells, each having an electrode, the method comprising:
    measuring a respective actual voltage, current, and temperature of each of the multiple battery cells;
    transmitting measured state signals indicative of the actual state of the battery back to a controller;
    responsive to the measured state signals, generating an estimated voltage of the battery cells via the controller using a respective open-circuit voltage and low-frequency transient voltage of each of the multiple battery cells, including estimating the low-frequency transient voltages using a discretized porous electrode transient (PET) model having multiple open-circuit voltage elements in the form of an equivalent circuit model or partial differential equations that individually represent a charge distribution within a respective discretized layer of the electrode, wherein the multiple open-circuit voltage elements collectively represent an uneven charge distribution within an electrode of each of the multiple battery cells;
    estimate a state of charge (SOC) of the battery pack via the controller as an estimated SOC using the estimated voltage of the battery cells; and
    responsive to the estimated SOC, controlling an operating state of the electrical system in real-time via the controller.

13. The method of claim 12, wherein the multiple open-circuit voltage elements are represented in a memory location of the controller as the equivalent circuit model including: a charge-transfer resistance and an effective pore resistance for each of a number (N) of discretized layers of the electrode, and wherein N is equal to a number of the multiple open-circuit voltage elements.

14. The method of claim 13, wherein N≥3.

15. The method of claim 12, further comprising representing the multiple open-circuit voltage elements of the PET model in a memory location of the controller as a set of the partial differential equations representing a continuous SOC distribution $\theta_e(t,z)$, where t is time and z is a nondimensional depth of the electrode.

16. The method of claim 12, wherein the battery cells are lithium ion battery cells and the electrode is a negative electrode.

17. The method of claim 12, further comprising: periodically updating the PET model, using a Kalman filter, based on a difference between the estimated voltage and the actual voltage.

18. The method of claim 12, wherein the electrical system is in communication with a display device, further comprising: displaying the state of charge via the display device.

19. The method of claim 12, further comprising:
   deriving a numeric state of health of the battery pack using a time history of the estimated state; and
   outputting a signal indicative of the numeric state of health.

20. The method of claim 12, further comprising:
   when the operating mode is a discharging mode of the battery pack, delivering electrical energy from the battery pack to an electric machine coupled to a set of drive wheels of a vehicle to thereby propel the vehicle, and when the operating mode is a charging mode of the battery pack, drawing power from the load to charge the battery pack.

* * * * *